United States Patent
Ma et al.

(10) Patent No.: US 11,925,042 B2
(45) Date of Patent: Mar. 5, 2024

(54) ORGANIC ELECTROLUMINESCENT DEVICE

(71) Applicant: BOE TECHNOLOGY GROUP CO., LTD., Beijing (CN)

(72) Inventors: Kun Ma, Beijing (CN); Lei Chen, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 519 days.

(21) Appl. No.: 17/312,186

(22) PCT Filed: Aug. 31, 2020

(86) PCT No.: PCT/CN2020/112492
§ 371 (c)(1),
(2) Date: Jun. 9, 2021

(87) PCT Pub. No.: WO2022/041200
PCT Pub. Date: Mar. 3, 2022

(65) Prior Publication Data
US 2022/0320450 A1    Oct. 6, 2022

(51) Int. Cl.
*H01L 51/00*  (2006.01)
*H10K 50/11*  (2023.01)
(Continued)

(52) U.S. Cl.
CPC .............. *H10K 50/11* (2023.02); *H10K 50/12* (2023.02); *H10K 71/00* (2023.02);
(Continued)

(58) Field of Classification Search
CPC ......... H01L 51/00; H01L 51/50; H01L 51/56; H01L 51/5004; H01L 51/0072; H01L 51/5056; H01L 51/5072; H01L 51/5096; H01L 2251/552; H01L 2251/558; H01L 2251/5384; H10K 50/11; H10K 50/12;
(Continued)

(56) References Cited

U.S. PATENT DOCUMENTS

| 2011/0140089 | A1  | 6/2011 | Terao | |
|---|---|---|---|---|
| 2020/0212309 | A1* | 7/2020 | Choi | ............ H10K 85/6572 |
| 2023/0180606 | A1* | 6/2023 | Lee | ............ H10K 85/636 |
| | | | | 252/301.16 |

FOREIGN PATENT DOCUMENTS

| CN | 106558652 A | 4/2017 |
|---|---|---|
| CN | 108232025 A | 6/2018 |
| CN | 109994636 A | 7/2019 |

OTHER PUBLICATIONS

PCT International Search Report, Application No. PCT/CN2020/112492, dated Jun. 2, 2021, 8 pages: with English translation.
(Continued)

*Primary Examiner* — Chuong A Luu
(74) *Attorney, Agent, or Firm* — Armstrong Teasdale LLP

(57) ABSTRACT

The present disclosure relates to an organic electroluminescent device, in which co-host materials with a specific P:N ratio are used, and the energy level and mobility of the materials of the functional layers are adjusted to be within specific ranges, so that good device performances could be produced under a plurality of P:N ratios, thereby providing more possibilities for the selection of devices.

19 Claims, 2 Drawing Sheets

(51) Int. Cl.
  *H10K 50/12* (2023.01)
  *H10K 71/00* (2023.01)
  *H10K 85/60* (2023.01)
  *H10K 50/15* (2023.01)
  *H10K 50/16* (2023.01)
  *H10K 50/18* (2023.01)
  *H10K 101/00* (2023.01)
  *H10K 101/30* (2023.01)
  *H10K 101/40* (2023.01)
  *H10K 102/00* (2023.01)

(52) U.S. Cl.
  CPC ......... *H10K 85/6572* (2023.02); *H10K 50/15* (2023.02); *H10K 50/16* (2023.02); *H10K 50/18* (2023.02); *H10K 2101/30* (2023.02); *H10K 2101/40* (2023.02); *H10K 2101/90* (2023.02); *H10K 2102/351* (2023.02)

(58) Field of Classification Search
  CPC ........ H10K 50/15; H10K 50/16; H10K 50/18; H10K 85/30; H10K 85/60; H10K 85/342; H10K 85/631; H10K 85/622; H10K 85/636; H10K 85/654; H10K 71/00; H10K 2101/10; H10K 2101/30; H10K 2101/90; H10K 2102/351
  USPC .......................................................... 257/40
  See application file for complete search history.

(56) References Cited

OTHER PUBLICATIONS

PCT Written Opinion, Application No. PCT/CN2020/112492, dated Jun. 2, 2021, 7 pages.: with English translation of relevant part.

* cited by examiner

ORGANIC ELECTROLUMINESCENT DEVICE

CROSS REFERENCE TO RELATED APPLICATIONS

This patent application is a National Stage Entry of PCT/CN2020/112492 filed on Aug. 31, 2020, the disclosure of which is incorporated by reference herein in its entirety as part of the present application.

BACKGROUND

The present disclosure relates to an organic electroluminescent device, in which co-host materials with a specific P:N ratio are used, and the energy level and mobility of the materials of the functional layers are adjusted to be within specific ranges, so that good device performances could be produced under a plurality of P:N ratios, thereby providing more possibilities for the selection of devices.

In recent years, organic electroluminescent display (OLED), as a new type of flat panel display, has gradually received more attention. Due to its characteristics of active luminescence, high luminescent brightness, high resolution, wide viewing angle, fast response speed, low energy consumption, flexibility and the like, it has become a popular mainstream display product on the market.

With the continuous development of OLED technology, the study of high-efficiency organic materials which would affect OLED and the device performances draws more attention. An organic electroluminescent device with good efficiency and long lifetime is usually the result of an optimized combination of the device structure and various organic materials. This provides great opportunities and challenges for the design and development of the functional materials with various structures and device structures.

At present, most of the light-emitting devices based on phosphorescent host materials use two-component host (co-host) materials, in which one material is used as an electron-type material (N-type), and the other material is used as a hole-type material (P-type). Electrons and holes combine at the interface after being transported by the two materials. Compared with bipolar materials, the two materials used in the co-host materials have wider sources, and a combination of different materials can be used to achieve better device performances.

However, the ratio of P-type to N-type in the co-host materials has a huge impact on the emission layer and even on the entire device. How to find the best matching relationship between different ratios of P-type to N-type and the other functional layers is of great significance to the device performances.

BRIEF DESCRIPTION

In the course of the experiment, the inventors have surprisingly found that when the P:N ratio of the phosphorescent co-host materials changes, it has a great impact on the performances of the device. The reason may be that as the P:N ratio changes, the exciton recombination zone in the emission layer changes. Especially when the P:N ratio differs from each other greatly, the recombination zone would easily shift to a certain direction, thereby resulting in changes in efficiency and lifetime. However, in addition to the P:N ratio, the relationship between the functional layers and the host materials of the emission layer with respect to the energy level and the mobility is also a factor that influences the exciton recombination zone in the emission layer. Therefore, the present disclosure relates to an organic electroluminescent device, which defines the relationship between the P:N ratio in the host of the emission layer and the energy level and mobility of the material of the functional layers, thus allowing to produce good device performances under various P:N ratios, thereby providing more possibilities for the selection of devices. In addition, it has been surprisingly found that when the P:N ratio in the host of the emission layer is within a specific range, good device performances could be produced by setting the mobilities of the hole transport layer and the electron transport layer to be within specific ranges.

Therefore, the present disclosure relates to an organic electroluminescent device in which co-host materials with a specific P:N ratio are used, and the energy level and mobility of the materials of the functional layers are adjusted to be within specific ranges.

Specifically, the present disclosure relates to an organic electroluminescent device, which includes an anode, a hole transport layer (HTL), an electron blocking layer (EBL), an emission layer (EML), a hole blocking layer (HBL), an electron transport layer (ETL) and a cathode, wherein the emission layer contains at least one phosphorescent guest compound and at least two host materials, and the host materials are an N-type material and a P-type material, respectively, wherein the weight ratio of the N-type material to the P-type material P:N is from 1:5 to 5:1, wherein:

$0.02 \text{ eV} \leq \text{HOMO(HTL)} - \text{HOMO(EML)} \leq 0.65 \text{ eV}$, For example, $0.20 \text{ eV} \leq \text{HOMO(HTL)} - \text{HOMO(EML)} \leq 0.60 \text{ eV}$, As another example, $0.35 \text{ eV} \leq \text{HOMO(HTL)} - \text{HOMO(EML)} \leq 0.60 \text{ eV}$.

In one embodiment of the present disclosure, $0.25 \text{ eV} \leq \text{LUMO(EML)} - \text{LUMO(ETL)} \leq 1.00 \text{ eV}$, For example, $0.30 \text{ eV} \leq \text{LUMO(EML)} - \text{LUMO(ETL)} \leq 0.60 \text{ eV}$, As another example, $0.25 \text{ eV} \leq \text{LUMO(EML)} - \text{LUMO(ETL)} \leq 0.50 \text{ eV}$.

In one embodiment of the present disclosure, $0.01 \text{ eV} \leq \text{HOMO(HTL)} - \text{HOMO(EBL)} \leq 0.28 \text{ eV}$, For example, $0.03 \text{ eV} \leq \text{HOMO(HTL)} - \text{HOMO(EBL)} \leq 0.25 \text{ eV}$, As another example, $0.05 \text{ eV} \leq \text{HOMO(HTL)} - \text{HOMO(EBL)} \leq 0.20 \text{ eV}$.

In one embodiment of the present disclosure, $1.00 \text{ eV} \leq \text{LUMO(HBL)} - \text{LUMO(ETL)} \leq 1.50 \text{ eV}$, For example, $1.00 \text{ eV} \leq \text{LUMO(HBL)} - \text{LUMO(ETL)} \leq 1.30 \text{ eV}$, As another example, $1.00 \text{ eV} \leq \text{LUMO(HBL)} - \text{LUMO(ETL)} \leq 1.10 \text{ eV}$.

In one embodiment of the present disclosure,
(3) The HTL mobility is from $5.0 \times 10^{-6}$ cm$^2$/Vs to $1.0 \times 10^{-3}$ cm$^2$/Vs;

The ETL mobility is from $5.0 \times 10^{-8}$ cm$^2$/Vs to $8.0 \times 10^{-6}$ cm$^2$/Vs, For example, (3) The HTL mobility is from $1.0 \times 10^{-5}$ cm$^2$/Vs to $9.0 \times 10^{-4}$ cm$^2$/Vs, The ETL mobility is from $8.0 \times 10^{-8}$ cm$^2$/Vs to $6.0 \times 10^{-6}$ cm$^2$/Vs;

As another example, (3) The HTL mobility is from $5.5 \times 10^{-4}$ cm$^2$/Vs to $8.0 \times 10^{-4}$ cm$^2$/Vs, The ETL mobility is from $1.0 \times 10^{-7}$ cm$^2$/Vs to $3.0 \times 10^{-6}$ cm$^2$/Vs;

Wherein the mobility is tested according to the SCLC method.

In one embodiment of the present disclosure, P:N is from 1:4 to 4:1, for example from 1:3 to 3:1.

In another embodiment of the present disclosure, the present disclosure relates to an organic electroluminescent device, wherein:

When the P:N ratio is 7:3, $$0.40 \text{ eV} \leq \text{HOMO(HTL)} - \text{HOMO(EML)} \leq 0.55 \text{ eV}, \quad (1)$$

$$0.28 \text{ eV} \leq \text{LUMO(EML)} - \text{LUMO(ETL)} \leq 0.40 \text{ eV};$$

When P:N is 6:4, $$0.45 \text{ eV} \leq \text{HOMO(HTL)} - \text{HOMO(EML)} \leq 0.55 \text{ eV}, \quad (1)$$

$$0.30 \text{ eV} \leq \text{LUMO(EML)} - \text{LUMO(ETL)} \leq 0.40 \text{ eV}.$$

In one embodiment of the present disclosure,
When the P:N ratio is 7:3, $$0.05 \text{ eV} \leq \text{HOMO(HTL)} - \text{HOMO(EBL)} \leq 0.15 \text{ eV}, \quad (2)$$

$$1.00 \text{ eV} \leq \text{LUMO(HBL)} - \text{LUMO(ETL)} \leq 1.10 \text{ eV};$$

When P:N is 6:4, $$0.10 \text{ eV} \leq \text{HOMO(HTL)} - \text{HOMO(EBL)} \leq 0.20 \text{ eV}, \quad (2)$$

$$1.00 \text{ eV} \leq \text{LUMO(HBL)} - \text{LUMO(ETL)} \leq 1.10 \text{ eV}.$$

In one embodiment of the present disclosure,
When the P:N ratio is 7:3, (3) The HTL mobility is from $5.5 \times 10^{-4}$ cm$^2$/Vs to $8.0 \times 10^{-4}$ cm$^2$/Vs, The ETL mobility is from $1.0 \times 10^{-7}$ cm$^2$/Vs to $7.0 \times 10^{-7}$ cm$^2$/Vs;

When P:N is 6:4, (3) The HTL mobility is from $5.5 \times 10^{-4}$ cm$^2$/Vs to $8.0 \times 10^{-4}$ cm$^2$/Vs, The ETL mobility is from $1.0 \times 10^{-7}$ cm$^2$/Vs to $3.0 \times 10^{-7}$ cm$^2$/Vs;

Wherein the mobility is tested according to the SCLC method.

In one embodiment of the present disclosure,
When the P:N ratio is 5:5, $$0.40 \text{ eV} \leq \text{HOMO(HTL)} - \text{HOMO(EML)} \leq 0.50 \text{ eV}, \quad (1)$$

$$0.25 \text{ eV} \leq \text{LUMO(EML)} - \text{LUMO(ETL)} \leq 0.35 \text{ eV}.$$

In one embodiment of the present disclosure,
When the P:N ratio is 5:5, $$0.05 \text{ eV} \leq \text{HOMO(HTL)} - \text{HOMO(EBL)} \leq 0.15 \text{ eV}, \quad (2)$$

$$1.00 \text{ eV} \leq \text{LUMO(HBL)} - \text{LUMO(ETL)} \leq 1.10 \text{ eV}.$$

In one embodiment of the present disclosure,
When the P:N ratio is 5:5, (3) The HTL mobility is from $5.5 \times 10^{-4}$ cm$^2$/Vs to $8.0 \times 10^{-4}$ cm$^2$/Vs, The ETL mobility is from $5.0 \times 10^{-7}$ cm$^2$/Vs to $8.0 \times 10^{-7}$ cm$^2$/Vs;

Wherein the mobility is tested according to the SCLC method.

In one embodiment of the present disclosure,
When the P:N ratio is 4:6, $$0.45 \text{ eV} \leq \text{HOMO(HTL)} - \text{HOMO(EML)} \leq 0.60 \text{ eV}, \quad (1)$$

$$0.25 \leq \text{LUMO(EML)} - \text{LUMO(ETL)} \leq 0.40 \text{ eV};$$

When the P:N ratio is 3:7, $$0.40 \text{ eV} \leq \text{HOMO(HTL)} - \text{HOMO(EML)} \leq 0.55 \text{ eV}, \quad (1)$$

$$0.27 \leq \text{LUMO(EML)} - \text{LUMO(ETL)} \leq 0.35 \text{ eV}.$$

In one embodiment of the present disclosure,
When the P:N ratio is 4:6, $$0.10 \text{ eV} \leq \text{HOMO(HTL)} - \text{HOMO(EBL)} \leq 0.20 \text{ eV}, \quad (2)$$

$$1.00 \leq \text{LUMO(HBL)} - \text{LUMO(ETL)} \leq 1.10 \text{ eV};$$

When the P:N ratio is 3:7, $$0.10 \text{ eV} \leq \text{HOMO(HTL)} - \text{HOMO(EBL)} \leq 0.20 \text{ eV}; \quad (2)$$

$$0.50 \leq \text{LUMO(HBL)} - \text{LUMO(ETL)} \leq 1.0 \text{ eV}.$$

In one embodiment of the present disclosure,
When the P:N ratio is 4:6, (3) The HTL mobility is from $5.5 \times 10^{-4}$ cm$^2$/Vs to $8.0 \times 10^{-4}$ cm$^2$/Vs, The ETL mobility is from $9.0 \times 10^{-7}$ cm$^2$/Vs to $2.0 \times 10^{-6}$ cm$^2$/Vs;

When the P:N ratio is 3:7, (3) The HTL mobility is from $8.0 \times 10^{-5}$ cm$^2$/Vs to $8.0 \times 10^{-4}$ cm$^2$/Vs, The ETL mobility is from $1.0 \times 10^{-7}$ cm$^2$/Vs to $6.0 \times 10^{-7}$ cm$^2$/Vs;

Wherein the mobility is tested according to the SCLC method.

In one embodiment of the present disclosure, LUMO(EML)-2.0 eV and HOMO(EML)$\geq$-6.0 eV.

In one embodiment of the present disclosure, the total concentration of the phosphorescent guest compounds is 5-20 wt %, for example 8-14 wt %, as another example 9-12 wt %, based on the sum of the weight of the host material and the guest material.

The structure of the organic electroluminescent device of the present disclosure is known in the art. As shown in FIG. 1, it includes an anode 101 and a cathode 107 on a substrate, and an organic layer between the anode and the cathode, wherein the organic layer may be a multilayer structure. For example, the organic material layer may include a hole transport layer 102, an electron blocking layer 103, an emission layer 104, a hole blocking layer 105, and an electron transport layer 106. The organic material layer of the present disclosure may further include an electron injection layer.

Anode materials may be transparent conductive materials known in the prior art such as indium tin oxide (ITO), indium zinc oxide (IZO), tin dioxide (SnO$_2$), zinc oxide (ZnO), and the like, but also metal materials such as silver and an alloy thereof, aluminum and an alloy thereof, and the like, organic conductive materials such as poly(ethylendioxythiophene) (PEDOT), and the like, and multilayer structures of the above materials.

Cathode materials may be selected from, but not limited to, materials such as LiF/Al, ITO, metals, oxides, and the like. The metals may be selected from Mg, Ag, Al and alloys thereof, may be selected from Mg/Ag alloy and Mg/Al alloy. The oxides may be selected from yttrium oxide, scandium oxide, and rare earth metal oxides.

Between the emission layer and the anode are the hole transport layer (HTL) and the electron blocking layer (EBL), the material of which may be selected from, but not limited to, one or more of the following HT-1 to HT-10.
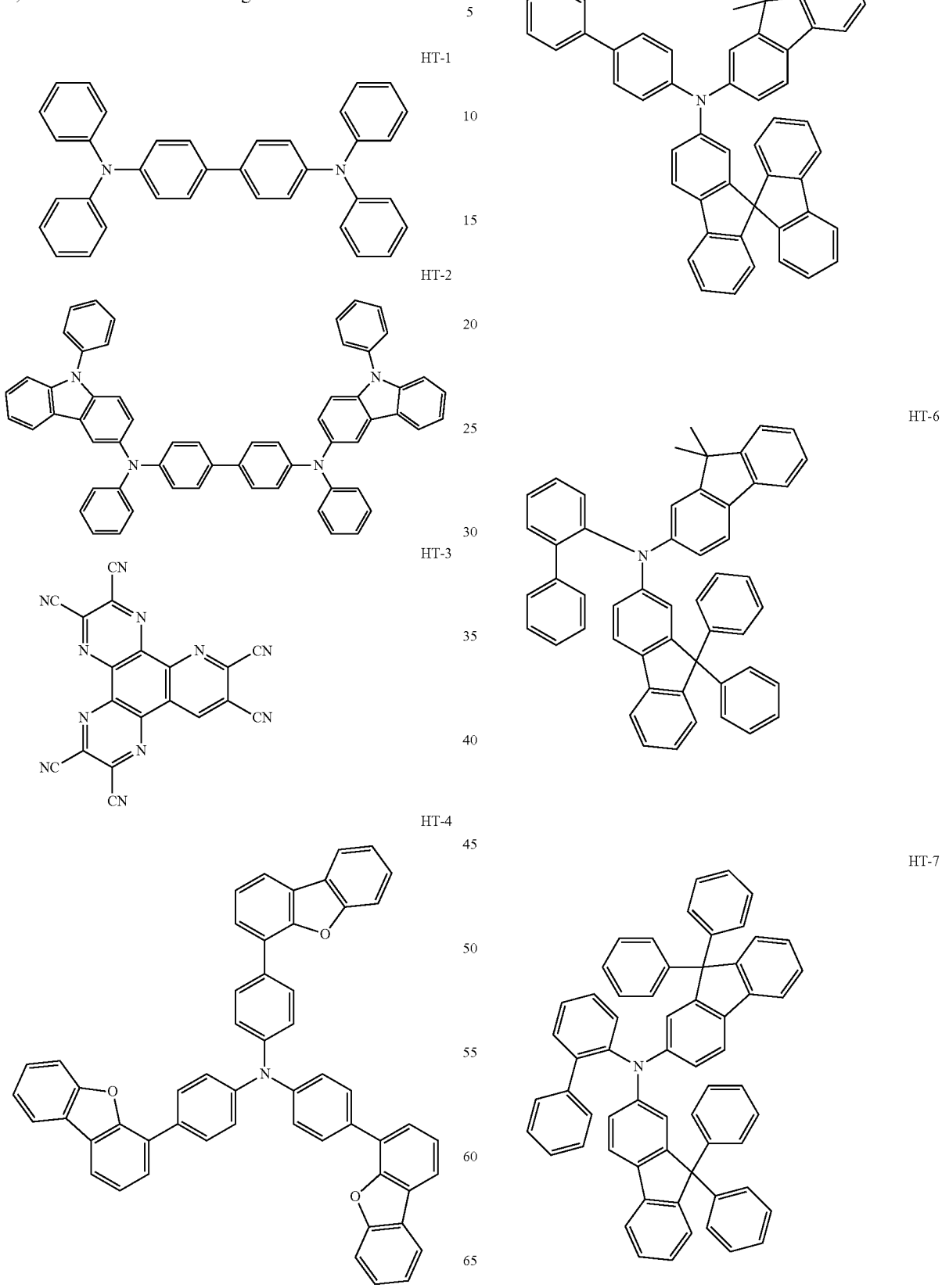

HT-8

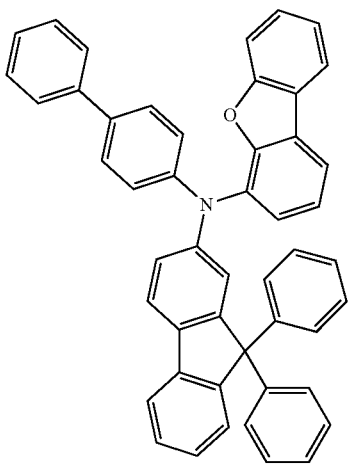

HT-10

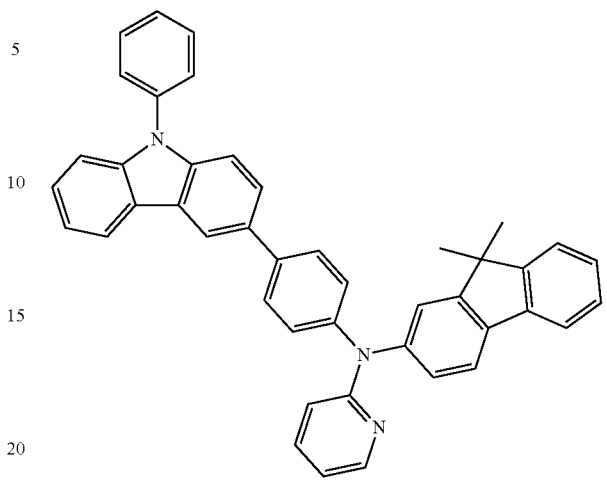

HT-9

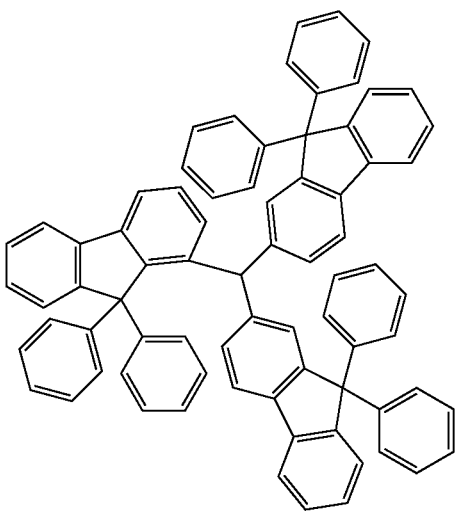

The emission layer may include a host material and a guest material, wherein the host material is a co-host, that is, it includes N-type and P-type host materials. In one embodiment of the present disclosure, the P-type material is one or more selected from the group consisting of triarylamine derivatives, carbazole derivatives, fused carbazole derivatives, carbazole triphenylene derivatives, and dibenzofuran and benzofuranyl dibenzofuran derivatives; the N-type material is one or more selected from triazine derivatives, pyrimidine derivatives, diazaphosphole derivatives, indolocarbazole derivatives substituted by an electron-deficient heteroaromatic group, and indenocarbazole derivatives substituted by an electron-deficient heteroaromatic group. The N-type and P-type host materials respectively may include, but are not limited to, one or more of the following conventional materials:

P-type:

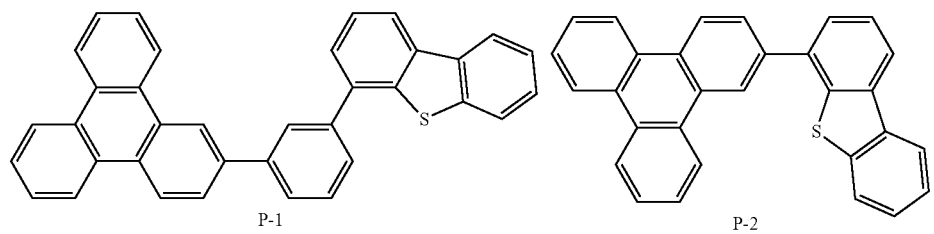

P-1        P-2

-continued
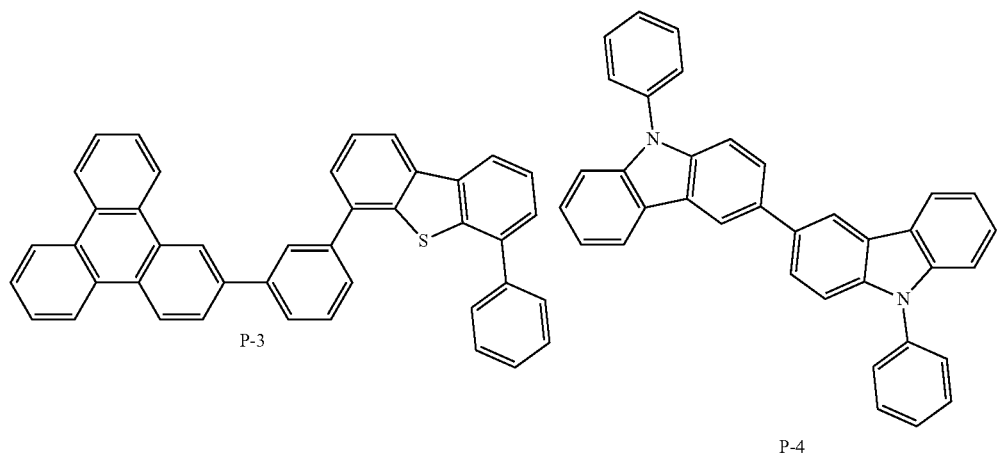
P-3
P-4
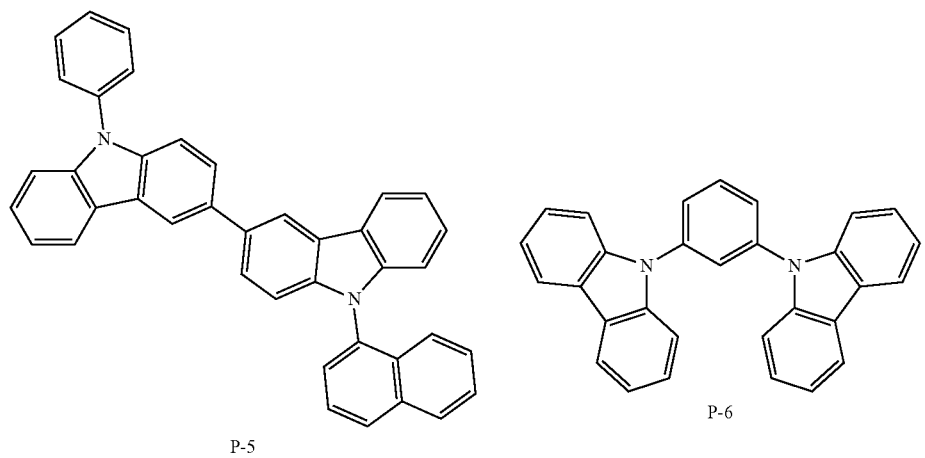
P-5
P-6
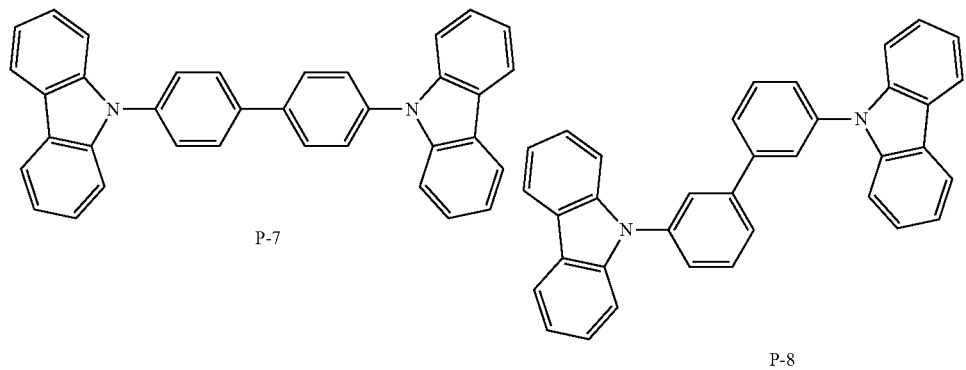
P-7
P-8

N-type:
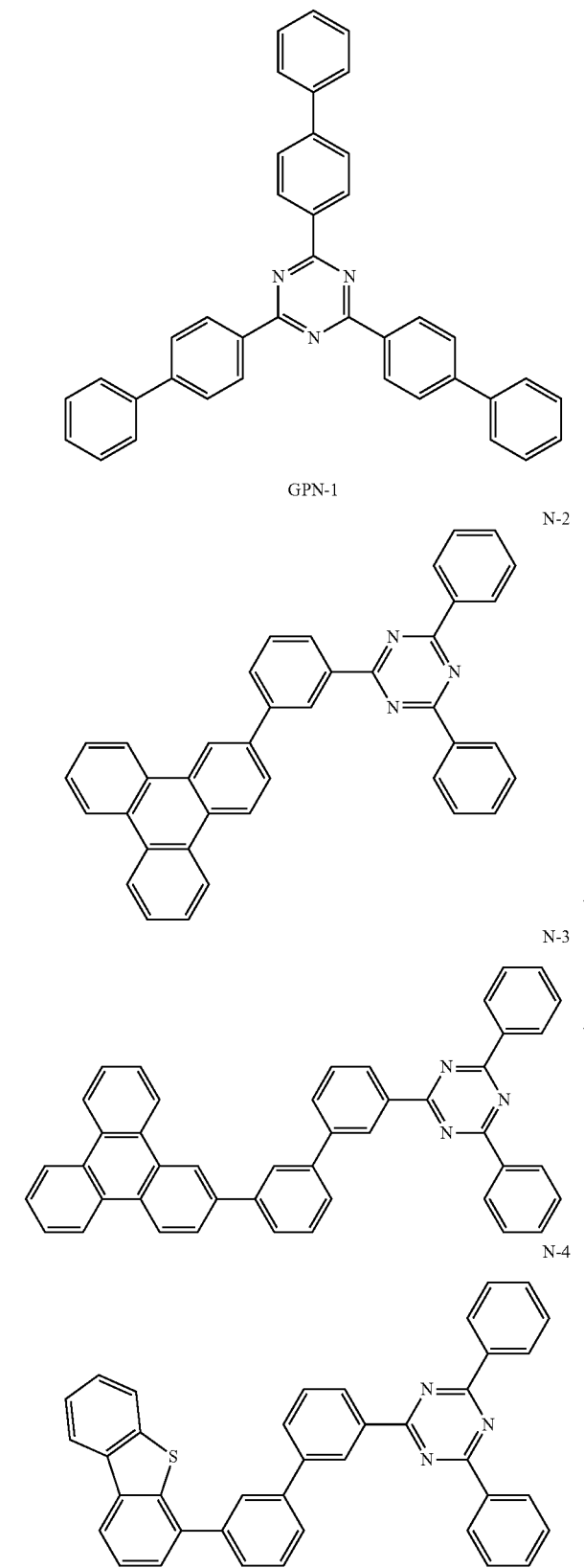
GPN-1
N-1
N-2
N-3
N-4
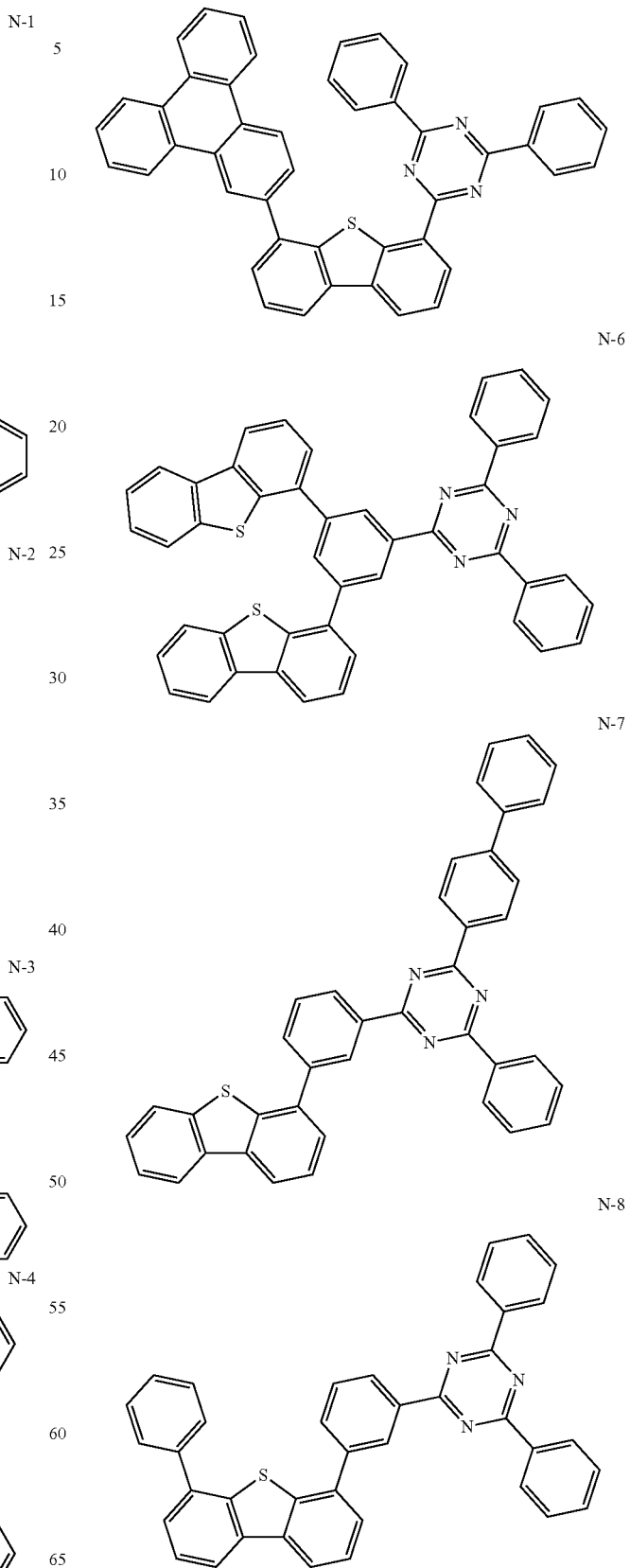
N-5
N-6
N-7
N-8

The guest material of the emission layer may be selected from, but not limited to, one or more of the following GD-1 to GD-10:
GD-1
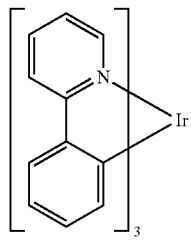
GD-2
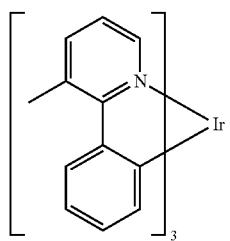
GD-3
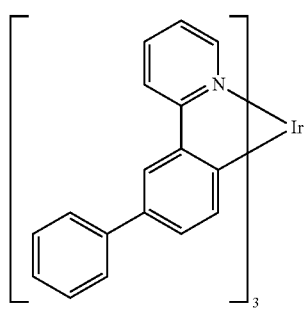
GD-4
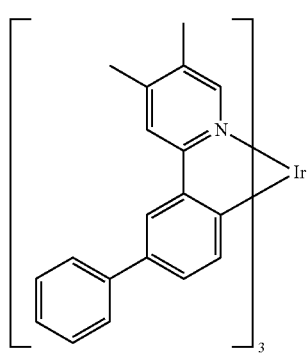
GD-5
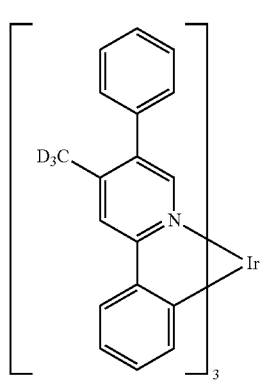
-continued
GD-6
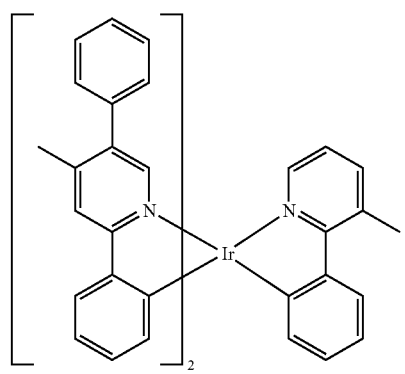
GD-7
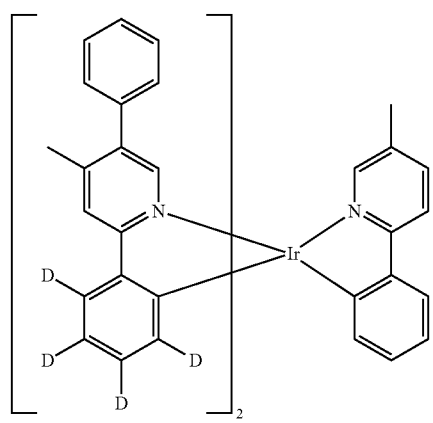
GD-8
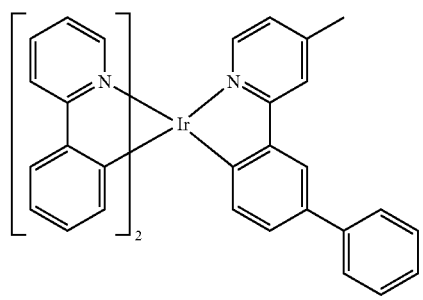
GD-9
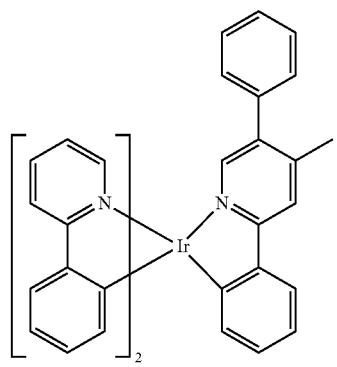

GD-10
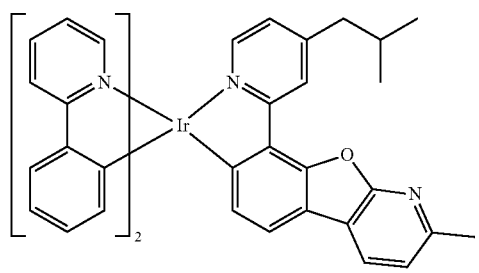
ET-3
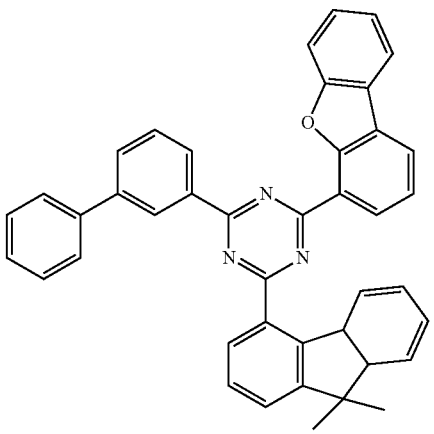
The materials of the electron transport layer (ETL) and the hole blocking layer (HBL) include, but are not limited to, one or more of the following ET-1 to ET-10:
ET-1
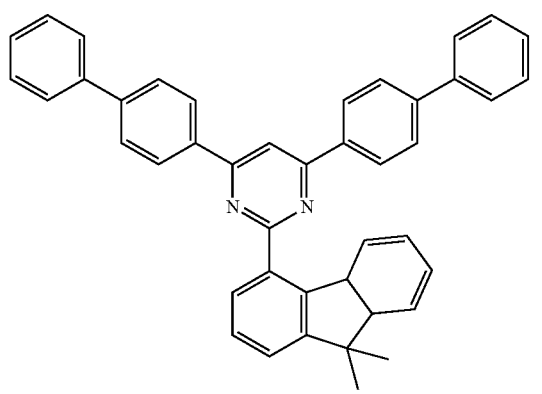
ET-4
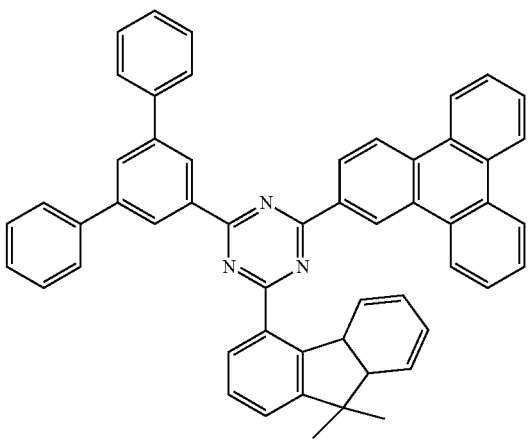
ET-2
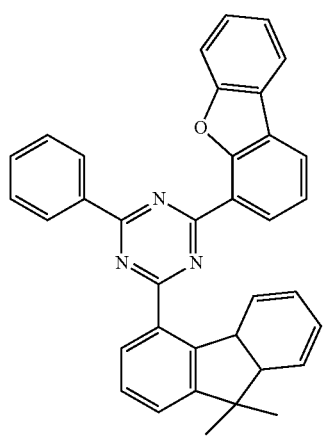
ET-5
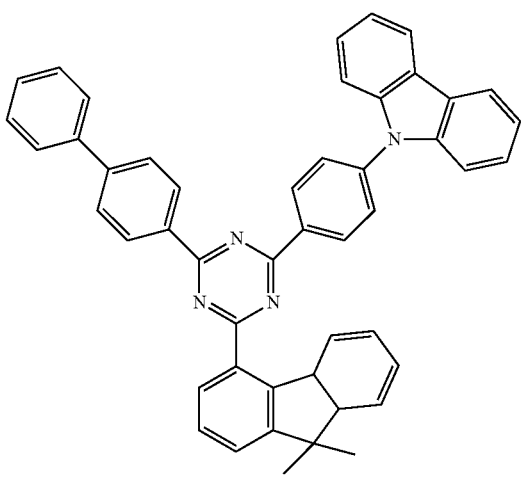

ET-6

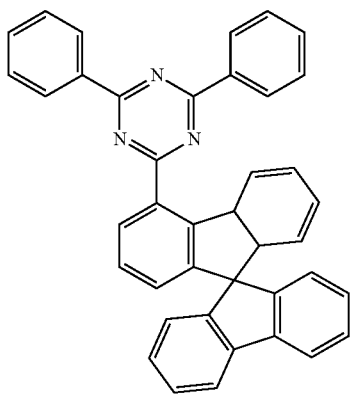

ET-7

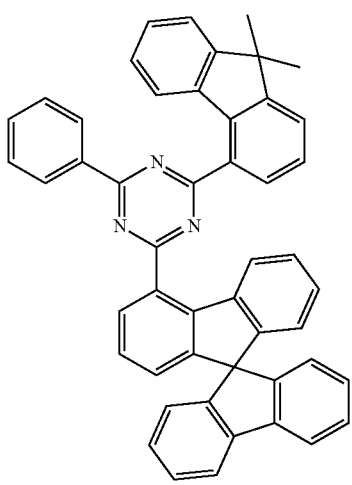

ET-8

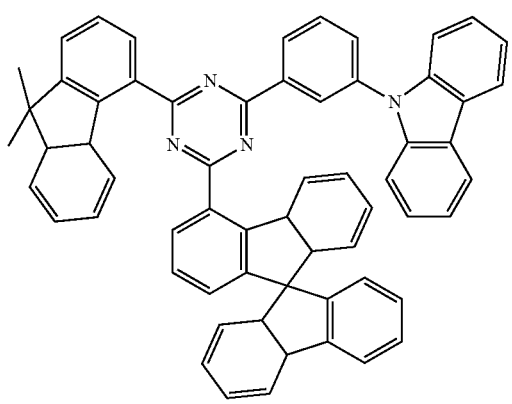

ET-9

ET-10

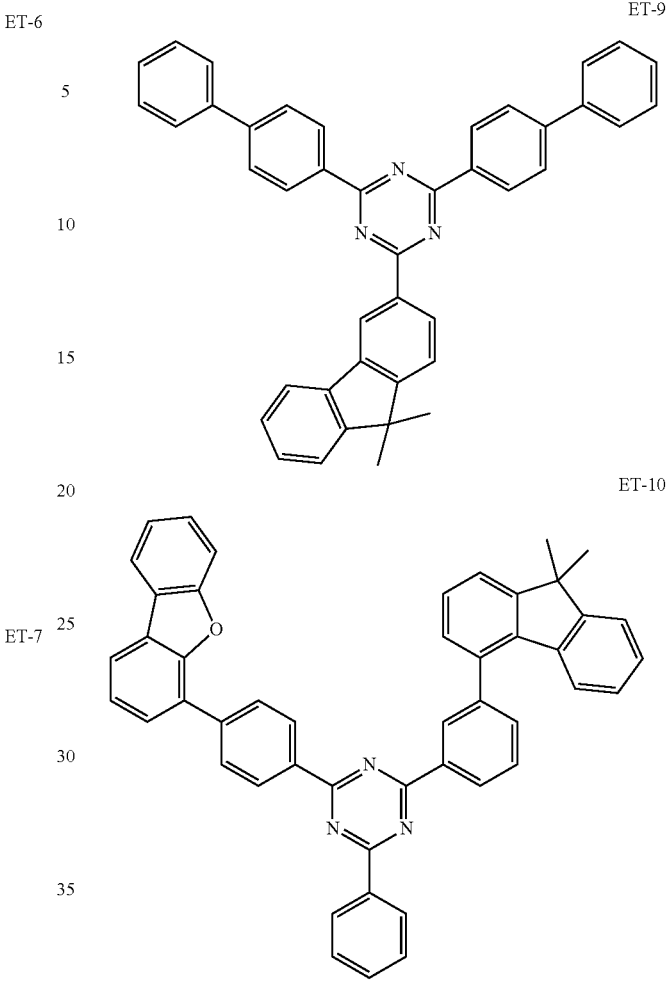

The material of the electron injection layer is selected from, but not limited to, LiF, Yb, LIQ, Mg:LiF, and the like.

HTL and ETL can be evaporation-plated separately, or two or more materials can be co-evaporation-plated (doped) together.

The film thickness of each layer is known in the art, for example:

Anode: 10-300 nm, for example 50-250 nm, as another example 100-200 nm;

Hole transport layer: 10-200 nm, for example 50-150 nm, as another example 80-120 nm;

Electron blocking layer: 0.5-20 nm, for example 0.8-10 nm, as another example 0.8-5 nm;

Emission layer: 5-100 nm, for example 10-50 nm, as another example 20-40 nm;

Hole blocking layer: 0.5-20 nm, for example 0.8-10 nm, as another example 0.8-5 nm;

Electron transport layer: 5-100 nm, for example 10-50 nm, as another example 20-40 nm;

Electron injection layer: 0.5-20 nm, for example 0.8-10 nm, as another example 0.8-5 nm;

Cathode: 10-300 nm, for example 50-250 nm, as another example 100-200 nm.

The present disclosure also relates to a method for preparing the OLED device of the present disclosure, which includes stacking the respective layers in sequence. The various layers of the OLED device of the present disclosure can be stacked by an evaporation-plating technology.

In an embodiment of the present disclosure, the specific process of the evaporation-plating technology can be by using the method of electric current heating, the desired materials are evaporated into atoms or molecules. Due to the thermal movement of the atoms or molecules, they separate from the materials per se and move upward. In the course of the movement, they contact with the substrate, accumulate and are condensed on the substrate to form the respective film layers. Among these, the process for preparing each film layer by high-temperature evaporation-plating is performed in an environment with a vacuum degree higher than $4\times10^{-4}$ Pa, may be from $1\times10^{-5}$ Pa to $1\times10^{-6}$ Pa. The evaporation-plating speed is 0.01-10 nm/s, may be 0.05-2 nm/s.

DETAILED DESCRIPTION

Examples

Figure 1:
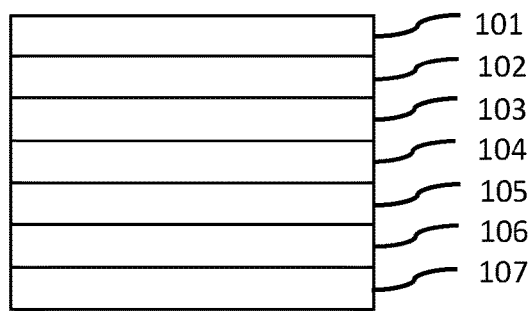
FIG. 1 is a diagram showing the structure of the OLED device as is known in the art.

The process for preparing the organic electroluminescent device is as follows:

(1) A glass plate with ITO is ultrasonically treated in a cleaning agent, rinsed in deionized water, ultrasonically degreased in an acetone-ethanol mixed solvent, and baked in a clean environment until the water is completely removed;

(2) The above glass substrate with an anode is placed in a vacuum chamber, which is evacuated to $1\times10^{-6}$ Pa, a hole transport layer is vacuum evaporation-plated on the film of the above anode layer, the evaporation-plating speed is 0.1 nm/s, and the evaporation-plated film thickness is 100 nm, the hole transport materials are shown in Table 1;

(3) 3,3'-di(9H-carbazole-9-yl)-1,1'-biphenyl (mCBP) is vacuum evaporation-plated on the hole transport layer to form an electron blocking layer of the device, the evaporation-plating speed is 0.05 nm/s, and the film thickness is 1 nm;

(4) An emission layer of the device is vacuum evaporation-plated on the electron blocking layer. The emission layer includes co-host materials P-7 and N-1, and P:N=7:3 to 3:7, the guest material is GD-1, a multi-source co-evaporation method is used, the weight ratio of the host material to the guest material is 90:10, the evaporation-plating speed of the host material is adjusted to 0.1 nm/s, the evaporation-plating speed of the guest material GD-1 is set to be 1/9 of that of the host material, and the total evaporation-plated film thickness is 30 nm;

(5) 2,9-dimethyl-4,7-diphenyl-1,10-phenanthroline (BCP) is vacuum evaporation-plated on the emission layer to form a hole blocking layer of the device, the evaporation-plating speed is 0.05 nm/s, and the film thickness is 1 nm;

(6) An electron transport layer of the device is vacuum evaporation-plated on the hole blocking layer, the evaporation-plating speed is 0.1 nm/s, the total evaporation-plated film thickness is 30 nm, and the electron transport materials are shown in Table 1;

(7) LiF with a thickness of 0.5 nm is vacuum evaporation-plated on the electron transport layer (ETL) as the electron injection layer;

(8) An Al layer with a thickness of 150 nm is used as the cathode of the device.

TABLE 1

|  | HTL | EML(P:N) | ETL | Efficiency (cd/A) | lifetime (LT95) h |
|---|---|---|---|---|---|
| Comparative Example 1 | HT-1 | P:N = 5:5 | ET-1 | 45.6 | 60 |
| Comparative Example 2 | HT-1 | P:N = 6:4 | ET-1 | 48.5 | 62 |
| Comparative Example 3 | HT-1 | P:N = 4:6 | ET-1 | 42.3 | 57 |
| Example 1 | HT-2 | P:N = 5:5 | ET-5 | 52.6 | 65 |
| Example 2 | HT-5 | P:N = 6:4 | ET-4 | 51.8 | 68 |
| Example 3 | HT-6 | P:N = 4:6 | ET-8 | 56.4 | 63 |

Wherein HOMO and LUMO of the HTL layer and ETL layer are as follows:

TABLE 2

| HTL | HOMO | LUMO | Mobility | ETL | HOMO | LUMO | Mobility |
|---|---|---|---|---|---|---|---|
| HT-1 | −5.23 | −2.24 | $5.3*10^{-4}$ | ET-1 | −6.45 | −3.20 | $4.6*10^{-7}$ |
| HT-2 | −5.44 | −2.37 | $6.8*10^{-4}$ | ET-5 | −6.5 | −3.26 | $5.7*10^{-7}$ |
| HT-5 | −5.37 | −2.34 | $6.4*10^{-4}$ | ET-4 | −6.47 | −3.30 | $2.3*10^{-7}$ |
| HT-6 | −5.35 | −2.40 | $7.2*10^{-4}$ | ET-8 | −6.42 | −3.28 | $1.2*10^{-6}$ |

Figure 2:
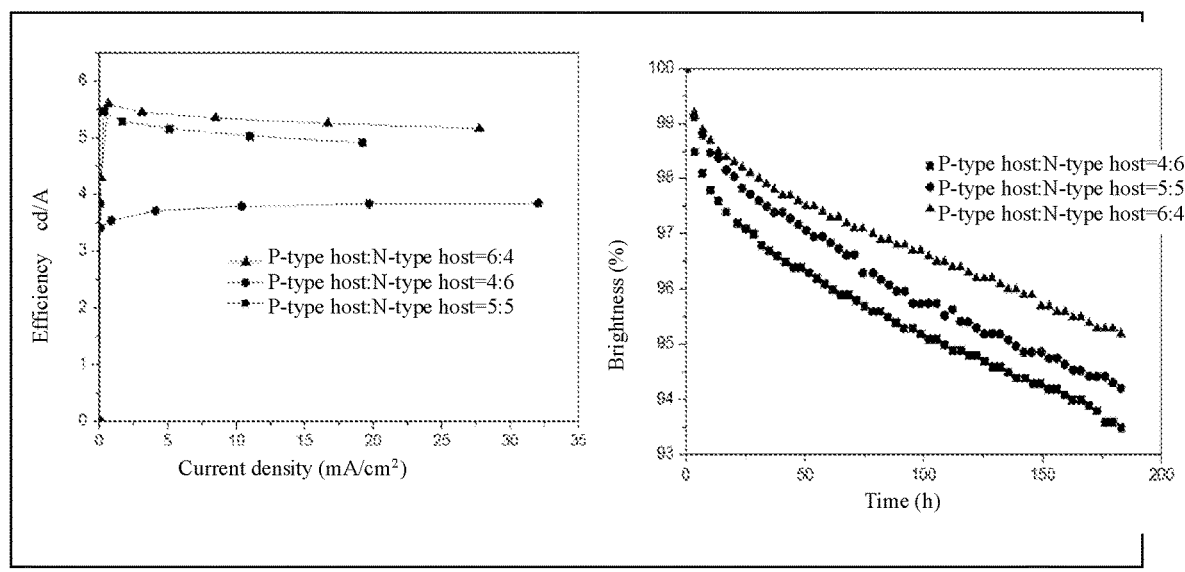
FIG. 2 shows the difference in efficiency and lifetime of the OLED device of the present disclosure under different ratios of the PN components.
Figure 3:
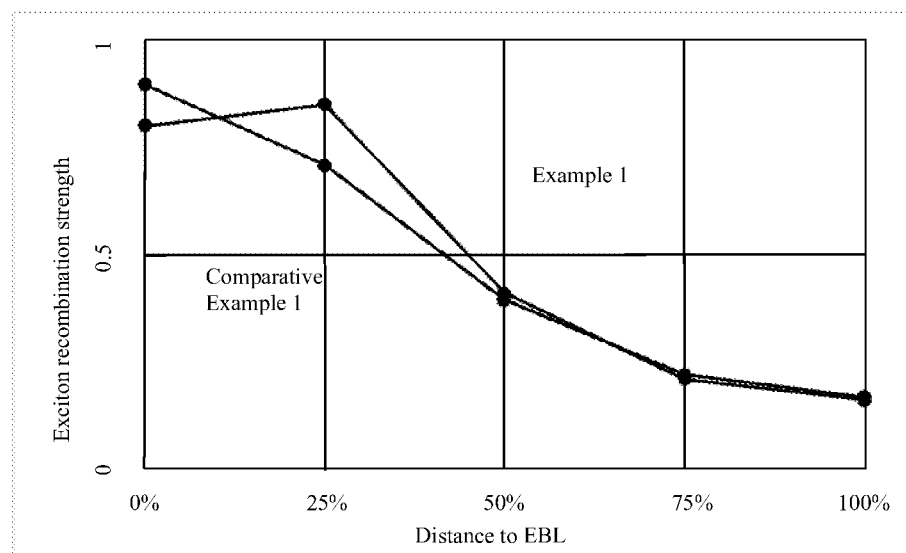
FIG. 3 shows the change of the exciton recombination zone of OLED devices of Example 1 and Comparative Example 1.

The HOMO and LUMO of the EML layer, HBL layer and EBL layer are as follows:
EML: HOMO=−5.90 eV LUMO=−2.96 eV
HBL: HOMO=−5.40 eV LUMO=−2.25 eV
EBL: HOMO=−5.53 eV LUMO=−2.31Ev As can be seen from the data in Tables 1-2 and FIGS. 2 and 3, when the energy level and mobility of the emission layer efficiently match to those of the functional layers, it has a good influence on the exciton recombination zone as well as the efficiency and lifetime of the device.

What is claimed is:

1. An organic electroluminescent device comprising an anode, a hole transport layer (HTL), an electron blocking layer (EBL), an emission layer (EML), a hole blocking layer (HBL), an electron transport layer (ETL), and a cathode, wherein the emission layer contains at least one phosphorescent guest compound and at least two host materials, wherein the host materials are an N-type material and a P-type material, respectively, wherein the weight ratio of the N-type material to the P-type material P:N is from 1:5 to 5:1, and wherein:

$$0.02\ eV \leq HOMO(HTL)-HOMO(EML) \leq 0.65\ eV.$$

2. The organic electroluminescent device according to claim 1, wherein:

$$0.25\ eV \leq LUMO(EML)-LUMO(ETL) \leq 1.00\ eV.$$

3. The organic electroluminescent device according to claim 1, wherein:

$$0.01\ eV \leq HOMO(HTL)-HOMO(EBL) \leq 0.28\ eV.$$

4. The organic electroluminescent device according to claim 3, wherein:

$$1.00\ eV \leq LUMO(HBL)-LUMO(ETL) \leq 1.50\ eV.$$

5. The organic electroluminescent device according to claim 1, wherein:

the HTL mobility is from $5.0\times10^{-6}$ cm$^2$/Vs to $1.0\times10^{-3}$ cm$^2$/Vs, the ETL mobility is from $5.0\times10^{-8}$ cm$^2$/Vs to $8.0\times10^{-6}$ cm$^2$/Vs, and the mobility is tested according to the SCLC method.

6. The organic electroluminescent device according to claim 1, wherein the weight ratio of P:N is from 1:4 to 4:1.

7. The organic electroluminescent device according to claim 1, wherein:

when the P:N ratio is 7:3, $$0.40 \text{ eV} \leq \text{HOMO(HTL)} - \text{HOMO(EML)} \leq 0.55 \text{ eV, and} \quad (1)$$

$$0.28 \text{ eV} \leq \text{LUMO(EML)} - \text{LUMO(ETL)} \leq 0.40 \text{ eV; and}$$

when P:N is 6:4, $$0.45 \text{ eV} \leq \text{HOMO(HTL)} - \text{HOMO(EML)} \leq 0.55 \text{ eV, and} \quad (1)$$

$$0.30 \text{ eV} \leq \text{LUMO(EML)} - \text{LUMO(ETL)} \leq 0.40 \text{ eV.}$$

8. The organic electroluminescent device according to claim 7, wherein:

when the P:N ratio is 7:3, $$0.05 \text{ eV} \leq \text{HOMO(HTL)} - \text{HOMO(EBL)} \leq 0.15 \text{ eV, and} \quad (2)$$

$$1.00 \text{ eV} \leq \text{LUMO(HBL)} - \text{LUMO(ETL)} \leq 1.10 \text{ eV; and}$$

when P:N is 6:4, $$0.10 \text{ eV} \leq \text{HOMO(HTL)} - \text{HOMO(EBL)} \leq 0.20 \text{ eV, and} \quad (2)$$

$$1.00 \text{ eV} \leq \text{LUMO(HBL)} - \text{LUMO(ETL)} \leq 1.10 \text{ eV.}$$

9. The organic electroluminescent device according to claim 7, wherein:

when the P:N ratio is 7:3, (3) the HTL mobility is from $5.5\times10^{-4}$ cm$^2$/Vs to $8.0\times10^{-4}$ cm$^2$/Vs, and the ETL mobility is from $1.0\times10^{-7}$ cm$^2$/Vs to $7.0\times10^{-7}$ cm$^2$/Vs; and when P:N is 6:4, (3) the HTL mobility is from $5.5\times10^{-4}$ cm$^2$/Vs to $8.0\times10^{-4}$ cm$^2$/Vs, and the ETL mobility is from $1.0\times10^{-7}$ cm$^2$/Vs to $3.0\times10^{-7}$ cm$^2$/Vs;

wherein the mobility is tested according to the SCLC method.

10. The organic electroluminescent device according to claim 1, wherein:

when the P:N ratio is 5:5, $$0.40 \text{ eV} \leq \text{HOMO(HTL)} - \text{HOMO(EML)} \leq 0.50 \text{ eV, and} \quad (1)$$

$$0.25 \text{ eV} \leq \text{LUMO(EML)} - \text{LUMO(ETL)} \leq 0.35 \text{ eV.}$$

11. The organic electroluminescent device according to claim 10, wherein:

when the P:N ratio is 5:5, $$0.05 \text{ eV} \leq \text{HOMO(HTL)} - \text{HOMO(EBL)} \leq 0.15 \text{ eV, and} \quad (2)$$

$$1.00 \text{ eV} \leq \text{LUMO(HBL)} - \text{LUMO(ETL)} \leq 1.10 \text{ eV.}$$

12. The organic electroluminescent device according to claim 10, wherein:

when the P:N ratio is 5:5, (3) the HTL mobility is from $5.5\times10^{-4}$ cm$^2$/Vs to $8.0\times10^{-4}$ cm$^2$/Vs, and the ETL mobility is from $5.0\times10^{-7}$ cm$^2$/Vs to $8.0\times10^{-7}$ cm$^2$/Vs;

wherein the mobility is tested according to the SCLC method.

13. The organic electroluminescent device according to claim 1, wherein:

when the P:N ratio is 4:6, $$0.45 \text{ eV} \leq \text{HOMO(HTL)} - \text{HOMO(EML)} \leq 0.60 \text{ eV, and} \quad (1)$$

$$0.25 \leq \text{LUMO(EML)} - \text{LUMO(ETL)} \leq 0.40 \text{ eV; and}$$

when the P:N ratio is 3:7, $$0.40 \text{ eV} \leq \text{HOMO(HTL)} - \text{HOMO(EML)} \leq 0.55 \text{ eV, and} \quad (1)$$

$$0.27 \leq \text{LUMO(EML)} - \text{LUMO(ETL)} \leq 0.35 \text{ eV.}$$

14. The organic electroluminescent device according to claim 13, wherein:

when the P:N ratio is 4:6, $$0.10 \text{ eV} \leq \text{HOMO(HTL)} - \text{HOMO(EBL)} \leq 0.20 \text{ eV, and} \quad (2)$$

$$1.00 \leq \text{LUMO(HBL)} - \text{LUMO(ETL)} \leq 1.10 \text{ eV;}$$

when the P:N ratio is 3:7, $$0.10 \text{ eV} \leq \text{HOMO(HTL)} - \text{HOMO(EBL)} \leq 0.20 \text{ eV, and} \quad (2)$$

$$0.50 \leq \text{LUMO(HBL)} - \text{LUMO(ETL)} \leq 1.0 \text{ eV.}$$

15. The organic electroluminescent device according to claim 13, wherein:

when the P:N ratio is 4:6, (3) the HTL mobility is from $5.5\times10^{-4}$ cm$^2$/Vs to $8.0\times10^{-4}$ cm$^2$/Vs, and the ETL mobility is from $9.0\times10^{-7}$ cm$^2$/Vs to $2.0\times10^{-6}$ cm$^2$/Vs; and when the P:N ratio is 3:7, (3) the HTL mobility is from $8.0\times10^{-5}$ cm$^2$/Vs to $8.0\times10^{-4}$ cm$^2$/Vs, and the ETL mobility is from $1.0\times10^{-7}$ cm$^2$/Vs to $6.0\times10^{-7}$ cm$^2$/Vs;

wherein the mobility is tested according to the SCLC method.

16. The organic electroluminescent device according to claim 1, wherein LUMO(EML)$\leq -2.0$ eV and HOMO(EML)$\geq -6.0$ eV.

17. The organic electroluminescent device according to claim 1, wherein the total concentration of the phosphorescent guest compounds is 5-20 wt %, based on the sum of the weight of the host material and the guest material.

18. The organic electroluminescent device according to claim 1, wherein the P-type material is one or more selected from the group consisting of triarylamine derivatives, carbazole derivatives, fused carbazole derivatives, carbazole triphenylene derivatives, and dibenzofuran and benzofuranyl dibenzofuran derivatives, and wherein the N-type material is one or more selected from triazine derivatives, pyrimidine derivatives, diazaphosphole derivatives, indolocarbazole derivatives substituted by an electron-deficient heteroaromatic group, and indenocarbazole derivatives substituted by an electron-deficient heteroaromatic group.

19. A method for preparing the organic electroluminescent device according to claim 1, which comprises stacking the respective layers in sequence.

* * * * *